(12) United States Patent
Owaki

(10) Patent No.: US 12,094,682 B2
(45) Date of Patent: Sep. 17, 2024

(54) ANALYSIS METHOD

(71) Applicant: Kioxia Corporation, Tokyo (JP)

(72) Inventor: Takeshi Owaki, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 395 days.

(21) Appl. No.: 17/683,629

(22) Filed: Mar. 1, 2022

(65) Prior Publication Data

US 2023/0010917 A1 Jan. 12, 2023

(30) Foreign Application Priority Data

Jul. 12, 2021 (JP) .................................. 2021-115245

(51) Int. Cl.
*H01J 37/244* (2006.01)
*H01J 37/26* (2006.01)
*H01J 37/28* (2006.01)

(52) U.S. Cl.
CPC ............ *H01J 37/244* (2013.01); *H01J 37/28* (2013.01); *H01J 2237/2802* (2013.01)

(58) Field of Classification Search
CPC ........ H01J 37/244; H01J 37/26; H01J 37/261; H01J 37/263; H01J 37/265; H01J 37/266;
(Continued)

(56) References Cited

U.S. PATENT DOCUMENTS

| | | | |
|---|---|---|---|
| 6,448,556 B1 * | 9/2002 | Cowley .................. | H01J 37/28 250/311 |
| 2011/0220796 A1 | 9/2011 | Nicolopoulos et al. | |

(Continued)

FOREIGN PATENT DOCUMENTS

| | | |
|---|---|---|
| JP | 2014-142357 A | 8/2014 |
| WO | WO-2010/052289 A1 | 5/2010 |

OTHER PUBLICATIONS

K. J. Ganesh, et al., "D-STEM: A Parallel Electron Diffraction Technique Applied to Nanomaterials" Materials Science and Engineering, The University of Texas at Austin, JEOL, USA Inc., Microscopy and Microanalysis, 16, 614-621, 2010, doi: 10.1017/S1431927610000334; 8 pages.

(Continued)

*Primary Examiner* — Sean M Luck
(74) *Attorney, Agent, or Firm* — Foley & Lardner LLP

(57) ABSTRACT

According to one embodiment, there is provided an analysis method by a scanning transmission electron microscope including a dark field detector that detects dark field images by irradiating a sample with electron beams and detecting electron beams that are transmitted through or scattered from the sample, and an electron beam detector that detects electron diffraction images at radiation points of the electron beams among the electron beams that are transmitted through the sample or scattered from detecting the electron beams transmitted through a hollow portion of the dark field detector. The analysis method includes scanning a plurality of the radiation points set in an attention area by sequentially radiating electron beams at preset incidence angles, and performing detection of dark field images of the attention area and detection of NBD images at each of the plurality of radiation points at the same time.

7 Claims, 14 Drawing Sheets

(58) Field of Classification Search
CPC ........ H01J 37/268; H01J 37/27; H01J 37/295; H01J 37/2955; H01J 2237/1505; H01J 2237/1506; H01J 2237/1507; H01J 2237/226; H01J 2237/228; H01J 2237/2446; H01J 2237/24465; H01J 2237/2447; H01J 2237/24475; H01J 2237/24495; H01J 2237/2611; H01J 2237/2614; H01J 2237/2617; H01J 2237/2802; H01J 2237/2803; H01J 2237/2804; H01J 2237/2805
See application file for complete search history.

(56) References Cited

U.S. PATENT DOCUMENTS

| | | | | |
|---|---|---|---|---|
| 2013/0292566 A1* | 11/2013 | Benner | ................ | H01J 37/244 250/311 |
| 2018/0337019 A1* | 11/2018 | Sagawa | ................ | H01J 37/244 |
| 2021/0082663 A1* | 3/2021 | Kohno | ................ | H01J 37/10 |

OTHER PUBLICATIONS

T. C. Pekin, et al., "Optimizing disk registration algorithms for nanobeam electron diffraction strain mapping," Department of Materials Science and Engineering, University of California, National Center for Electron Microscopy, Molecular Foundry, Lawrence Berkeley National Laboratory, Erich Schmid Institute of Materials Science,, Ultramicroscopy vol. 176, May 2017, pp. 170-176, URL:https://doi.org/10.1016/j.ultramic.2016.12.021; 7 pages.

V. B. Ozdol, et al., "Strain mapping at nanometer resolution using advanced nano-beam electron diffraction," Applied Physics Letters 106, 253107 (2015), Jun. 24, 2015 URL: https://doi.org/10.1063/1.4922994; 6 pages.

W. Wan, et al., "Three-dimensional rotation electron diffraction: software RED for automated data collection and data processing" Inorganic and Structural Chemistry and Berzelii Centre EXSELENT on Porous Materials, Department of Materials and Environmental Chemistry, Stockholm University, Arrhenius Laboratory, Journal of Applied Crystallography (2013). 46, 1863-1873, Oct. 9, 2013, doi:10.1107/S0021889813027714; 11 pages.

* cited by examiner

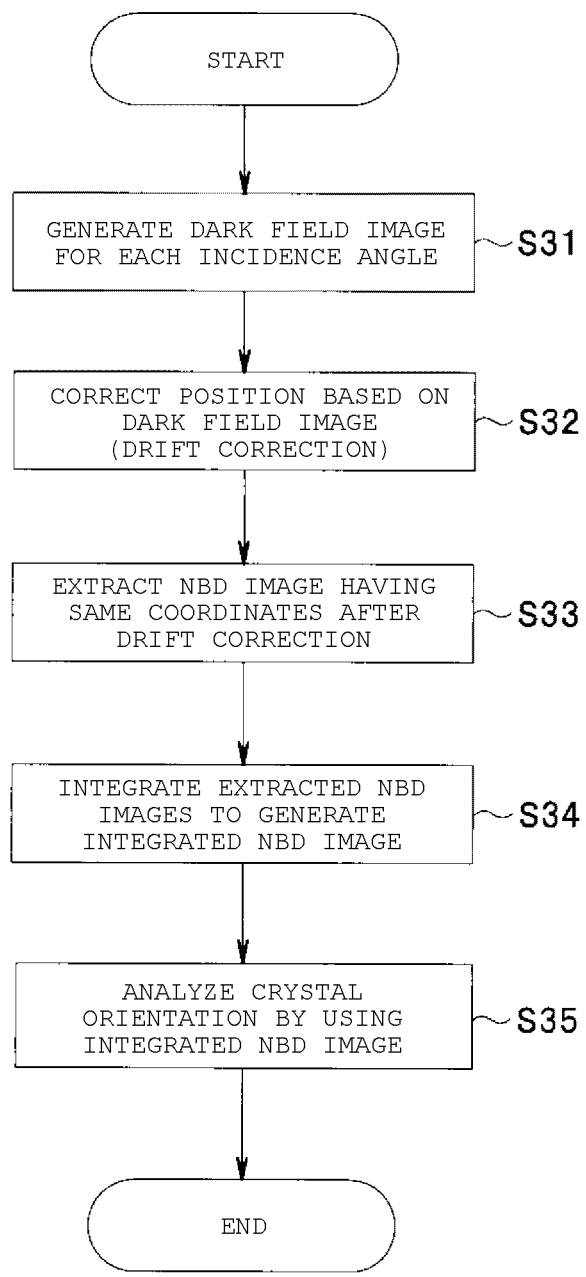

ANALYSIS METHOD

CROSS-REFERENCE TO RELATED APPLICATION

This application is based upon and claims the benefit of priority from Japanese Patent Application No. 2021-115245, filed Jul. 12, 2021, the entire contents of which are incorporated herein by reference.

FIELD

Embodiments described herein relate generally to an analysis method.

BACKGROUND

In metals and semiconductor materials, an analysis method using nano beam electron diffraction (NBD) with a scanning transmission electron microscope (STEM) is generally used to specify the crystal orientation in a local area.

DESCRIPTION OF THE DRAWINGS

FIG. 11 is a flowchart showing an example of the analysis procedure in the embodiment.

DETAILED DESCRIPTION

Embodiments provide an analysis method capable of reducing damage to a sample due to electron beam radiation and acquiring an electron diffraction image with high accuracy.

In general, according to one embodiment, there is provided an analysis method using a scanning transmission electron microscope including an annular first detector that detects dark field images in a sample by accelerating electron beams emitted from a beam radiation unit, irradiating the sample so that focal points of the electron beams are located on the sample, and detecting electron beams that are transmitted through the sample or scattered from the sample and a second detector that detects electron diffraction images of the sample at radiation positions of the electron beams by detecting electron beams that are transmitted through a hollow portion of the first detector among the electron beams that are transmitted through the sample or scattered from the sample. The analysis method includes scanning a plurality of radiation points set in an analysis area on a surface of the sample by sequentially radiating the electron beams at preset incidence angles, and performing detection of the dark field images of the analysis area and detection of the electron diffraction image at each of the plurality of radiation points at the same time.

Hereinafter, embodiments will be described with reference to drawings.

1. Apparatus

Figure 1:
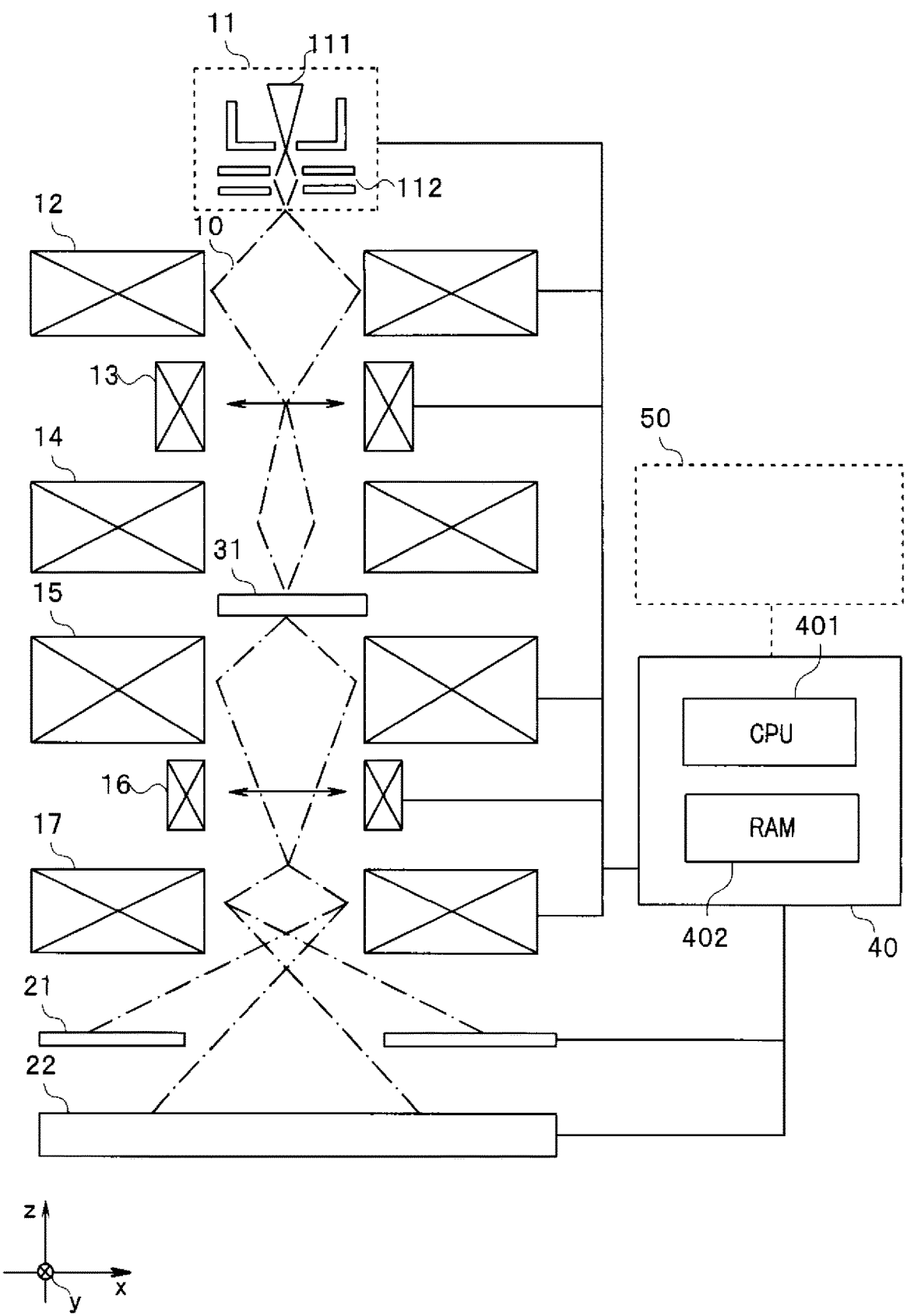
FIG. 1 is a schematic view showing a configuration example of a scanning transmission electron microscope in an embodiment.

FIG. 1 is a schematic view showing a configuration example of a scanning transmission electron microscope in an embodiment. A scanning transmission electron microscope of the present embodiment includes a beam radiation unit (or beam radiator) 11, a condenser lens 12, a scanning coil 13, an objective lens 14, an intermediate lens 15, a descanning coil 16, and a projection lens 17. The scanning transmission electron microscope also includes a dark field detector 21, an electron beam detector 22, and a control unit 40. The scanning transmission electron microscope may further include a display unit 50 for displaying an analysis result. A sample 31 is held in a subject holding portion (not shown) and is disposed between the objective lens 14 and the intermediate lens 15.

If it is assumed that the two orthogonal directions parallel to the surface of the sample 31 (the surface on which the electron beam 10 is incident) are an x direction and a y direction, and the direction perpendicular to the surface of the sample 31 (the direction perpendicular to an x-y plane) is a z direction, along the z direction, the beam radiation unit 11, the condenser lens 12, the scanning coil 13, the objective lens 14, the sample 31, the intermediate lens 15, the descanning coil 16, the projection lens 17, the dark field detector 21, and the electron beam detector 22 are disposed in this order.

The beam radiation unit 11 includes an electric field emission type electron gun 111 that serves as an electron source for emitting the electron beam 10, and an acceleration unit 112 that accelerates the emitted electron beam 10. The condenser lens 12 converges the electron beam 10 accelerated by the acceleration unit 112. The scanning coil 13 scans the radiation position of the electron beam 10 on the surface of the sample 31 in the x direction and/or the y direction. The objective lens 14 further converges the electron beam 10 into a micro electron beam (nano beam).

The intermediate lens 15 magnifies the electron diffraction image created by the objective lens 14 and forms an image on the object surface of the projection lens 17 in the subsequent stage. The descanning coil 16 swings the position shift of the electron beam 10 by the scanning coil 13 from an optical axis back to the optical axis. That is, the radiation position of the electron beam 10 is corrected by shifting the radiation position of the electron beam 10 in an opposite direction by the amount that the radiation position of the electron beam 10 is shifted from the optical axis of the condenser lens 12 by the scanning coil 13. The projection lens 17 further magnifies the electron diffraction image magnified by the intermediate lens 15 and forms an image on the dark field detector 21 and the electron beam detector 22.

The dark field detector 21 as a first detector is a ring-shaped electron beam detector having an opening formed in the central portion thereof. Among the electrons that are transmitted through the sample 31, those electrons that are scattered and diffracted at a high angle are detected. In the following description, the electron diffraction image detected by the dark field detector 21 is referred to as a dark field image (annular dark field image). The electron beam detector 22 as a second detector detects the electrons that are transmitted through the opening of the dark field detector 21 among the electrons that are transmitted through the sample 31. As the electron beam detector 22, for example, a fluorescent plate or a camera capable of directly detecting an electron beam is used. In the case of a fluorescent plate, the detected electrons are converted into light to obtain an electron diffraction image. In the following description, the electron diffraction image detected by the electron beam detector 22 is referred to as an NBD image.

The control unit 40 includes a central processing unit (CPU) 401 as a processor and a RAM 402. The CPU 401 operates according to a program stored in a memory (not shown), and has a control function for controlling the operation and setting of each part (beam radiation unit 11, condenser lens 12, scanning coil 13, objective lens 14, intermediate lens 15, descanning coil 16, projection lens 17, and the like) constituting the scanning transmission electron microscope, and also has a data analysis function for analyzing an electron diffraction image output from the dark field detector 21 or the electron beam detector 22. That is, the electron diffraction image input from the dark field detector 21 or the electron beam detector 22 is analyzed to specify the crystal orientation of the target area of the sample 31. The RAM 402 stores the analyzed data and various set values. In addition, the RAM 402 may also store a database used for matching with the measured electron diffraction image in order to specify the crystal orientation.

2. Analysis Method

2-1. Incidence Angle of Electron Beam

Figure 2A:
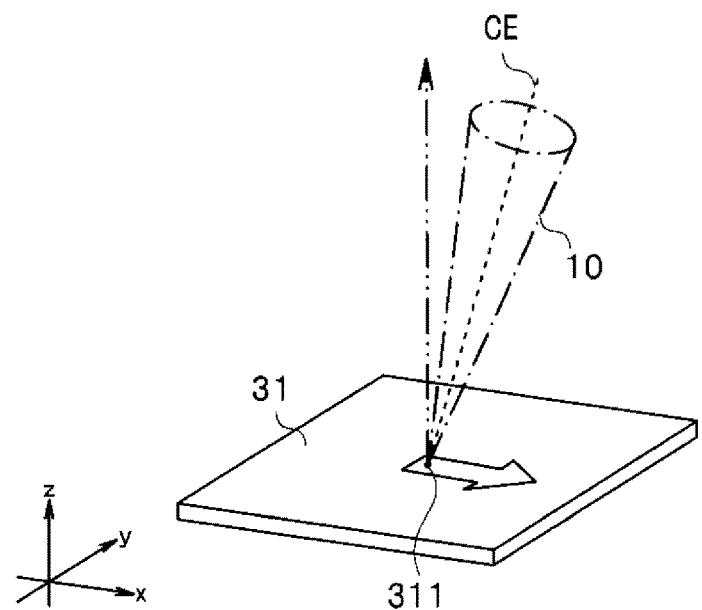
FIG. 2A is a view showing an incidence angle of an electron beam.
Figure 2B:
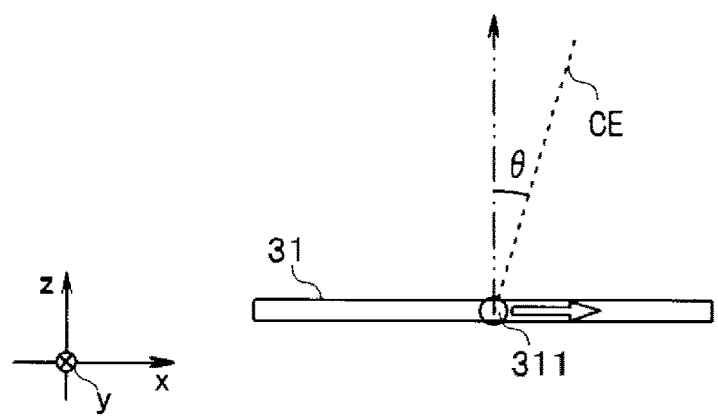
FIG. 2B is a view showing an incidence angle of the electron beam.
Figure 2C:
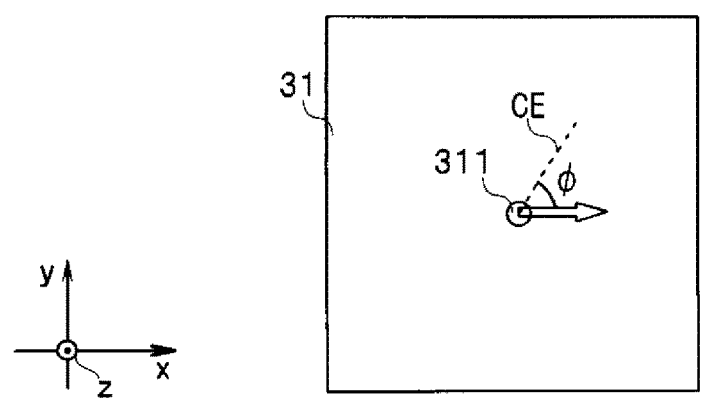
FIG. 2C is a view showing an incidence angle of the electron beam.

Next, an analysis method using a transmission electron microscope as described above will be described. FIGS. 2A to 2C are views showing the incidence angle of an electron beam. The transmission electron microscope acquires an electron diffraction image while scanning the electron beam 10 on the surface of the sample 31. At this time, the electron beam 10 is radiated while tilting by a predetermined angle with respect to the surface of the sample 31 (see FIG. 2A). Prior to the description of the analysis method, the incidence angle of the electron beam 10 is defined with reference to FIGS. 2B and 2C.

In each of FIGS. 2A to 2C, the central axis of the electron beam 10 is indicated by an axis CE. Further, the scanning direction of the electron beam 10 (the movement direction of a radiation point 311 of the electron beam 10 in the sample 31) is indicated by a thick white arrow. Further, the alternate long and short dash line with an arrow indicates a direction (z direction) perpendicular to the surface of the sample 31. FIG. 2B is a view (x-z plan view) of the sample 31 seen from the y direction. As shown in FIG. 2B, the angle formed by the direction perpendicular to the surface of the sample 31 and the central axis CE of the electron beam 10 is defined as an angle θ (first angle). Further, FIG. 2C is a view (x-y plan view) of the sample 31 seen from the direction. As shown in FIG. 2C, the angle formed by the scanning direction of the electron beam 10 and the axis CE of the electron beam 10 is defined as an angle φ (second angle). That is, the incidence angle of the electron beam 10 with respect to the surface of the sample 31 can be uniquely determined by the angle θ and the angle φ.

2-2. Analysis Procedure

Figure 3:
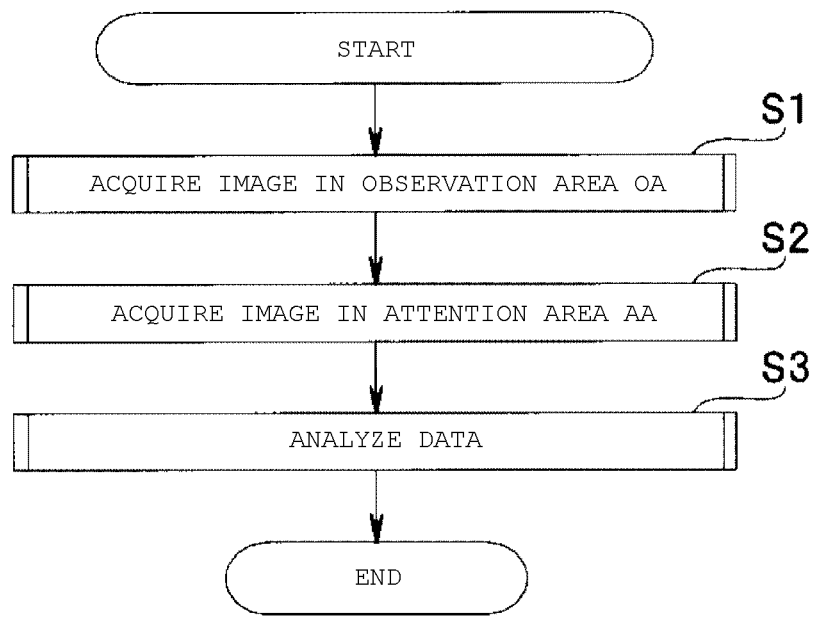
FIG. 3 is a flowchart showing an example of an analysis procedure of a sample.

FIG. 3 is a flowchart showing an example of a sample analysis procedure. As shown in FIG. 3, the analysis of the sample 31 is performed in three steps. First, an observation area OA is set on the surface of the sample 31, and an image (electron diffraction image) in the observation area OA is acquired (S1). Subsequently, based on the electron diffraction image acquired in S1, an attention area AA as the analysis area to be analyzed for the crystal orientation is set, and the image (electron diffraction image) in the attention area AA is acquired (S2). Finally, the electron diffraction image acquired in S2 is analyzed to generate the crystal orientation distribution of the attention area AA (S3). That is, S1 is a preliminary procedure for extracting an area for analyzing the crystal orientation (attention area AA), and S2 is a procedure for acquiring a highly accurate electron diffraction image used for analyzing the crystal orientation.

Figure 4:
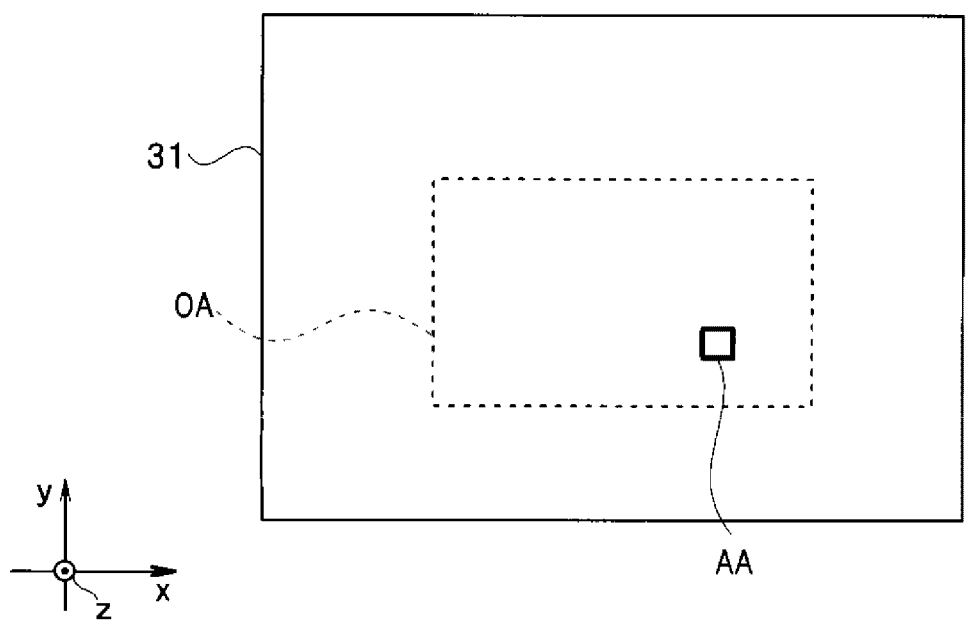
FIG. 4 is a view showing an electron diffraction image area acquired in each step of the analysis procedure.

FIG. 4 is a view showing an electron diffraction image area acquired in each step of the analysis procedure. The observation area OA is a part of the surface of the sample 31. The attention area AA is set in the observation area OA. For example, the observation area OA is set to a size of several μm square, and the attention area AA is set to a size of several nm to several tens of nm square.

Figure 5:
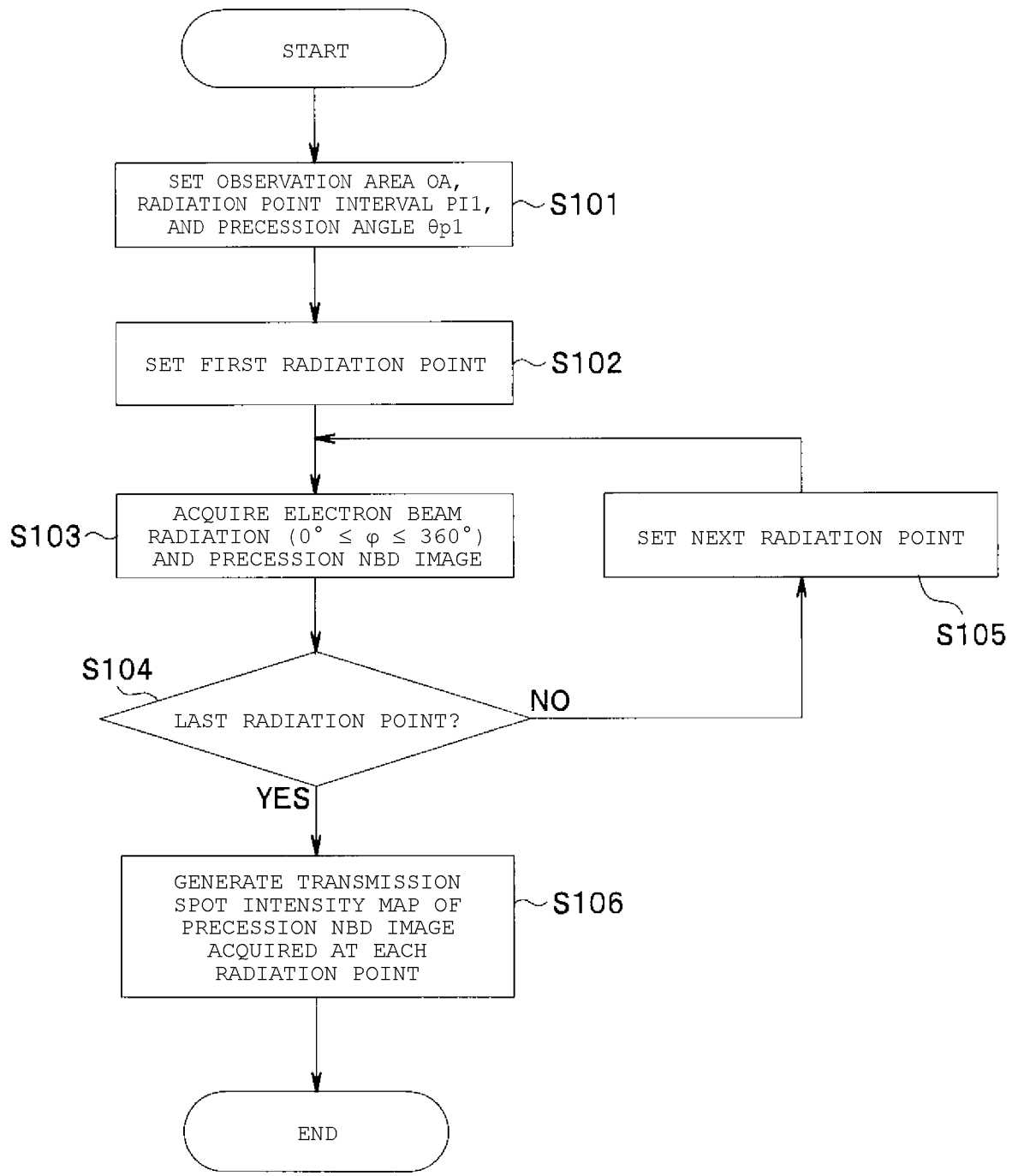
FIG. 5 is a flowchart showing an example of an analysis procedure in a comparative example.

A specific procedure will be described below for each step of the analysis procedure shown in FIG. 3. Prior to the description of the specific procedure of the embodiment, the specific procedure of a comparative example will be described with reference to FIGS. 5 to 8. FIG. 5 is a flowchart showing an example of an analysis procedure in the comparative example. The procedure shown in FIG. 5 shows a specific procedure of S1 in FIG. 3.

Figure 6:
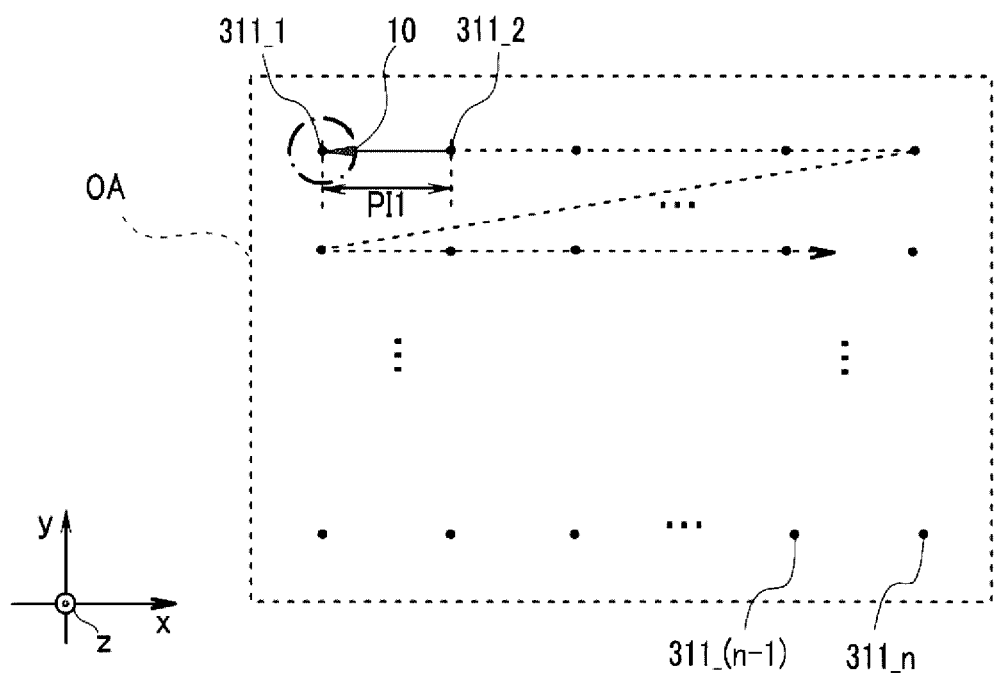
FIG. 6 is a view showing an example of disposition of radiation points in an observation area.

First, the observation area OA is set on the surface of the sample 31, and a radiation point interval PI1 is set (S101). Further, a first precession angle θp1 is set as the incidence angle θ of the electron beam 10. FIG. 6 is a view showing an example of disposition of radiation points in the observation area. As shown in FIG. 6, radiation points 311_1, 311_2, . . . , 311_n of the electron beam 10 in the observation area OA are disposed at regular intervals PI1 along the scanning direction. The diameter of the radiation point 311 (for example, about 1 nm in diameter) is smaller than the size of the observation area OA, and when the radiation point 311 is disposed so that the entire observation area OA is irradiated with the electron beam 10, the number of radiation points 311 becomes enormous, and the processing time becomes long. Since S1 is a step for identifying the attention area AA and the electron diffraction image necessary for analysis is acquired in the subsequent S2, in S101, the radiation points 311_1, 311_2, . . . , 311_n are disposed discretely at regular intervals PI1 to reduce the number of radiation points 311 and shorten the processing time.

Next, the radiation position of the electron beam 10 is set to a first radiation point 311_1 in the observation area OA (S102). That is, the control unit 40 controls the scanning coil 13 so that the radiation position of the electron beam 10 (convergence point on the surface of the sample 31) coincides with the radiation point 311_1.

Subsequently, the surface of the sample 31 is irradiated with an electron beam 10 to acquire an electron diffraction image (S103). At this time, as shown by the dashed line with an arrow in FIG. 6, the electron beam 10 precedes (0°≤φ≤360°) at an incidence angle θp1. While the electron beam 10 is radiated to the radiation point 311_1, the electron beam detector 22 continues to detect electrons (integrates the detected electrons). That is, the electron beam detector 22 outputs an integrated electron diffraction image. The time during which the electron beam detector 22 continuously detects electrons at one radiation point 311 is called an exposure time. The longer the exposure time is set, the larger the amount of electrons detected, and the clearer the electron diffraction image. An electron diffraction image acquired while making the electron beam 10 precede as in S103 is called a precession NBD image.

When a current radiation point 311_i set as the radiation position of the electron beam 10 is not the last radiation point 311_n, that is, when there is a radiation point 311 in the observation area OA where an precession NBD image has not been acquired (S104, NO), the radiation position of the electron beam 10 is moved from the current radiation point 311_i to the next radiation point 311_(i+1) according to the radiation point interval PI1 set in S101 (S105). Then, S103 is executed for the set radiation point 311_(i+1) to acquire a precession NBD image.

On the other hand, when the current radiation point 311_i is the last radiation point 311_n, that is, when the acquisition of precession NBD images is completed for all the radiation points 311 in the observation area OA (S104, YES), a transmission spot intensity map of the precession NBD image acquired at each radiation point 311 is generated (S106). The transmission spot intensity map is a pseudo bright-field image generated from the precession NBD image. From the precession NBD image acquired at each radiation point 311, the electron intensity of the area caused by the electrons transmitted through the sample 31 is extracted. Specifically, the electron intensity detected in the central area of the precession NBD image is extracted. A pseudo bright-field image is generated by mapping each electron intensity to the position of each radiation point 311 in the observation area OA. As described above, by executing a series of procedures from S101 to S106, the acquisition (S1) of an image (electron diffraction image) in the observation area OA is completed.

Figure 7:
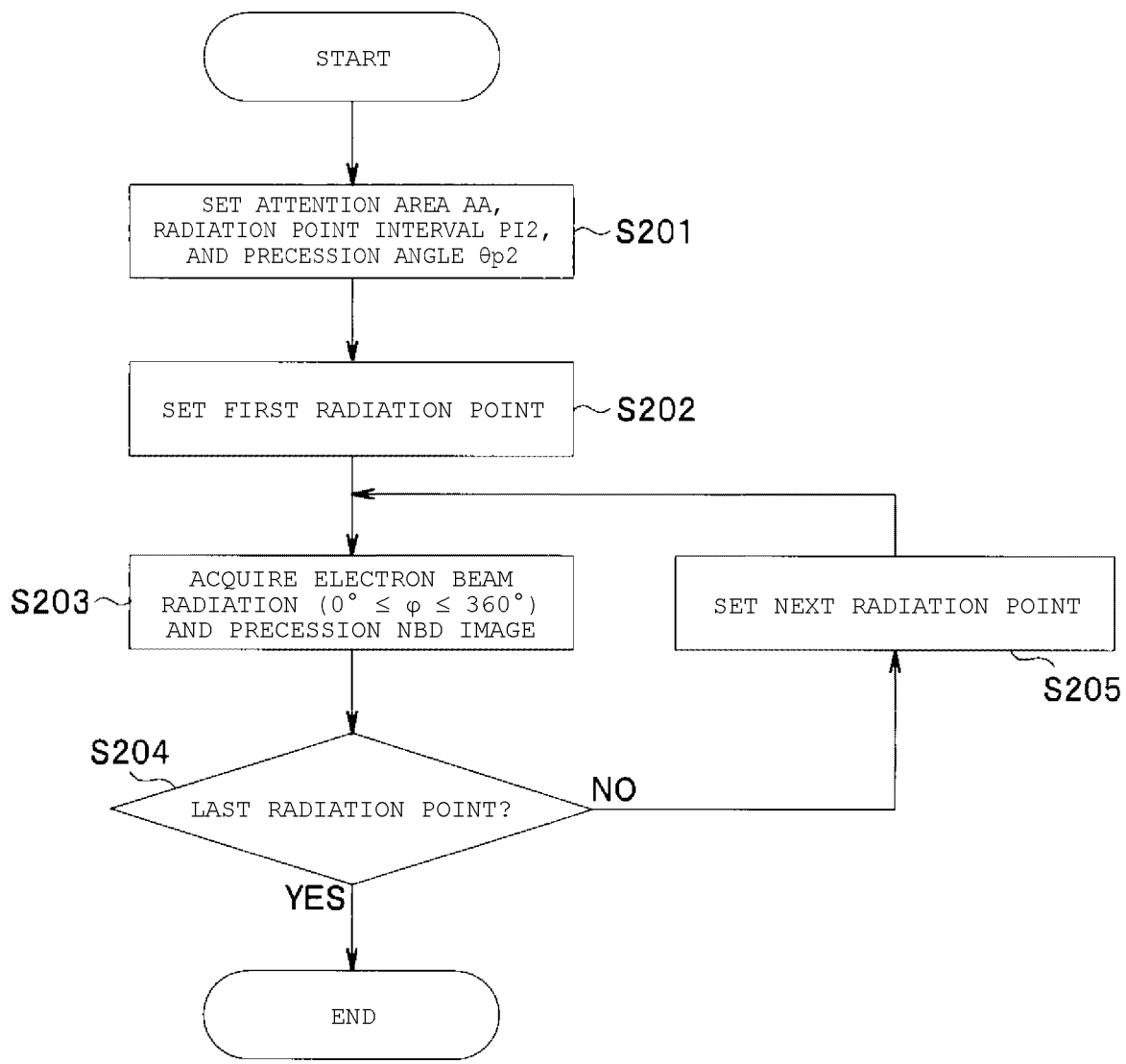
FIG. 7 is a flowchart showing an example of the analysis procedure in the comparative example.

FIG. 7 is a flowchart showing an example of the analysis procedure in the comparative example. The procedure shown in FIG. 7 shows a specific procedure in S2 of FIG. 3. First, the attention area AA is set in the observation area OA. Further, a radiation point interval PI2 and a second precession angle θp2, which is the incidence angle θ of the electron beam 10, are set (S201). The attention area AA is an area to be analyzed for specifying the crystal orientation. The attention area AA is extracted from the pseudo bright-field image generated in S1.

For example, in a semiconductor device having a wiring area formed so that a plurality of metal wirings are regularly arranged on a silicon substrate, when analyzing the crystal orientation of an interface layer between the silicon substrate and the metal wiring, the cross-section of the wiring area (cross-section cut along a plane perpendicular to the surface of the silicon substrate, including the silicon substrate and the metal wiring) is set as the observation area OA. With reference to the pseudo bright-field image of the observation area OA generated in S1, the position of the interface layer between the metal wiring and the silicon substrate in the observation area OA is specified. Then, the specified interface layer is extracted as the attention area AA.

Figure 8:
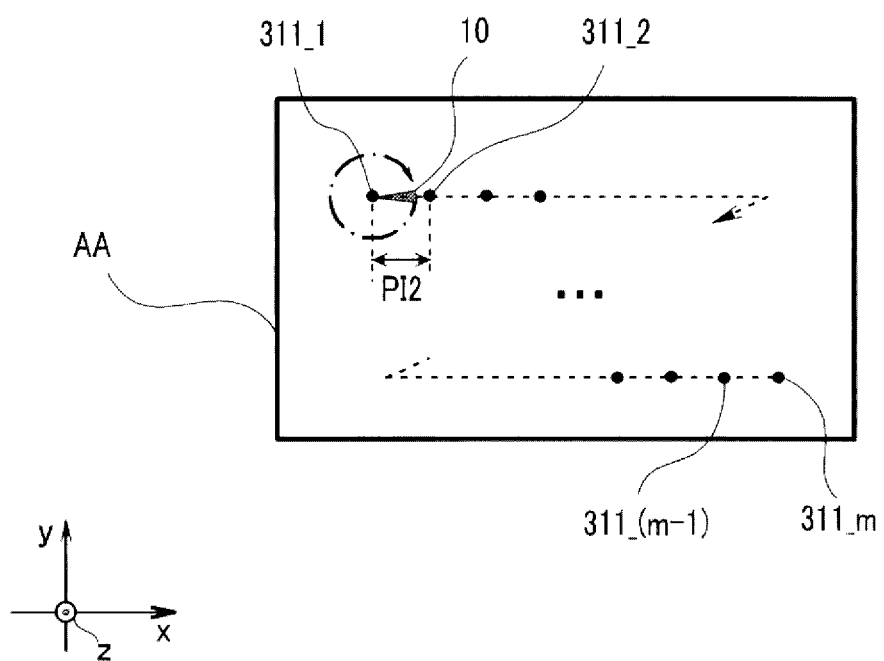
FIG. 8 is a view showing an example of disposition of radiation points in an attention area.

FIG. 8 is a view showing an example of disposition of radiation points in the attention area. As shown in FIG. 8, the radiation points 311_1, 311_2, . . . , 311_m of the electron beam 10 in the attention area AA are disposed at regular intervals PI2 along the scanning direction. The radiation point interval PI2 is set according to the fineness of the analysis target. For example, when the analysis target is a fine substance such as fine particles or a narrow band such as an interface, the radiation point interval PI2 is set small. The radiation point interval PI2 may be set to a value equal to or less than the diameter of the electron beam 10 so that the adjacent radiation points 311 have an overlap.

The second precession angle θp2 is set according to the diffraction pattern to be analyzed and the order of the diffraction lines to be acquired. In general, when the incidence angle θ of the electron beam 10 is increased, the influence of the dynamic effect becomes smaller, and therefore higher-order diffraction becomes more clearly visible. However, if the incidence angle θ is increased, the position resolution is lowered. The second precession angle θp2 is set in consideration thereof. The second precession angle θp2 may be the same as the first precession angle θp1.

Next, the radiation position of the electron beam 10 is set to the first radiation point 311_1 in the attention area AA (S202). That is, the control unit 40 controls the scanning coil 13 so that the radiation position of the electron beam 10 (convergence point on the surface of the sample 31) coincides with the radiation point 311_1. Subsequently, the surface of the sample 31 is irradiated with the electron beam 10 preceding (0°≤φ≤360°) at a predetermined angle (second precession angle θp2) set in advance, and a precession NBD image is acquired (S203).

When the current radiation point 311_j set as the radiation position of the electron beam 10 is not the last radiation point 311_m, that is, when there is a radiation point 311 in the attention area AA where an precession NBD image has not been acquired (S204, NO), the radiation position of the electron beam 10 is moved from a current radiation point 311_j to the next radiation point 311_(j+1) according to the radiation point interval PI2 set in S201 (S205). Then, S203 is executed for the set radiation point 311 (j+1) to acquire a precession NBD image.

On the other hand, when the current radiation point 311_j is the last radiation point 311_m, that is, when the acquisition of precession NBD images is completed for all the radiation points 311 in the attention area AA (S204, YES), the acquisition (S2) of an image (electron diffraction image) in the attention area AA is completed.

Finally, the precession NBD image acquired in S2 is analyzed to identify the crystal orientation of the attention area AA (S3). Specifically, each of the plurality of precession NBD images acquired in S2 is compared with a plurality of NBD images (templates) calculated in advance for various crystal orientations and stored in a database. The crystal orientation of the template with the highest degree of matching is identified as the crystal orientation at the radiation point where the precession NBD image is acquired. In this way, the distribution of the crystal orientation in the attention area AA of the sample 31 can be obtained. By adding the same mark to the radiation points having the same crystal orientation or connecting the radiation points having the same crystal orientation with a line, the crystal orientation mapping of the attention area AA can be generated.

Figure 9A:
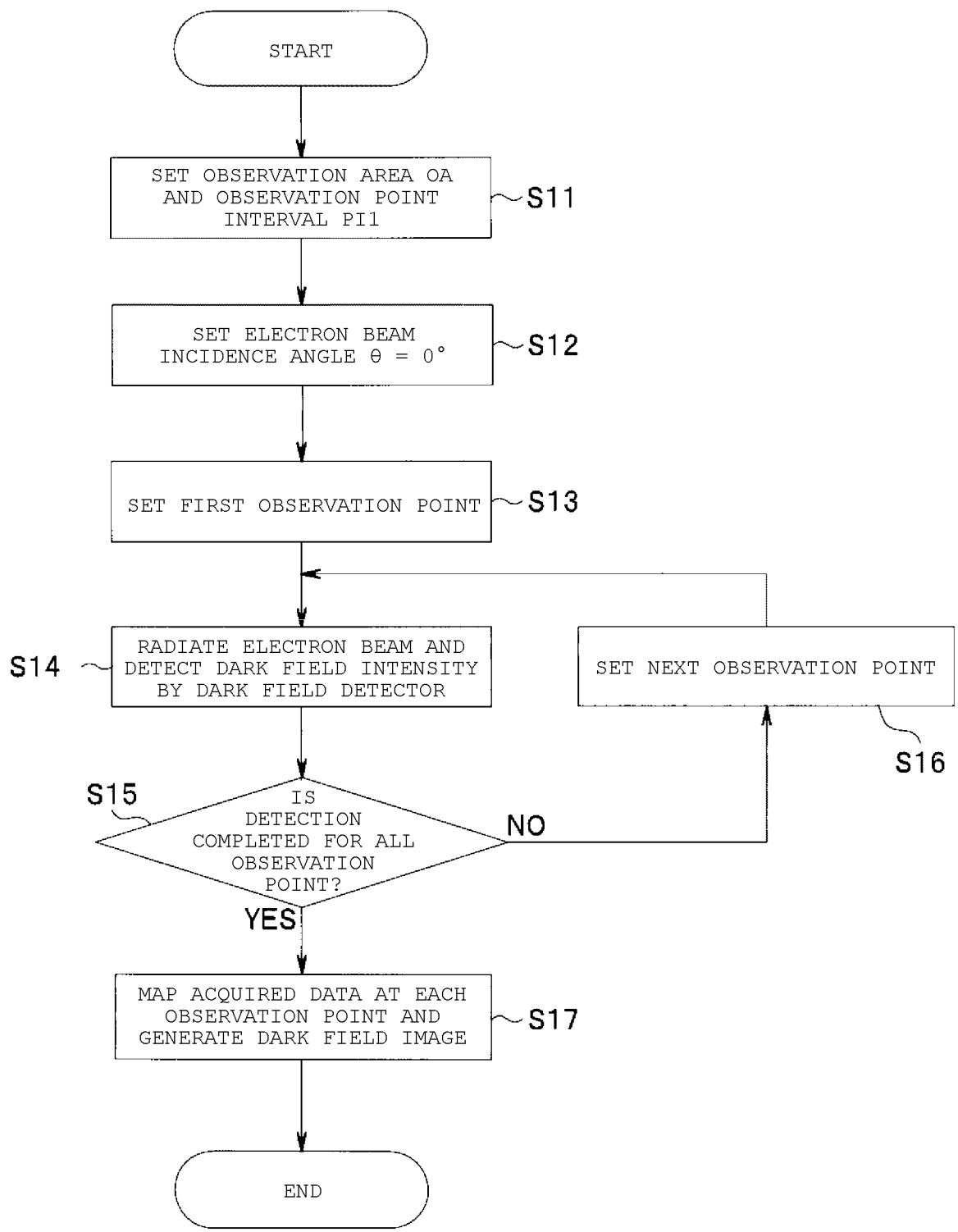
FIG. 9A is a flowchart showing an example of an analysis procedure according to the embodiment.

Next, a specific procedure of the embodiment will be described. The specific procedure of each step of the analysis procedure shown in FIG. 3 will be described below with reference to FIGS. 9 to 14. FIG. 9A is a flowchart showing an example of the analysis procedure in the embodiment.

Figure 9B:
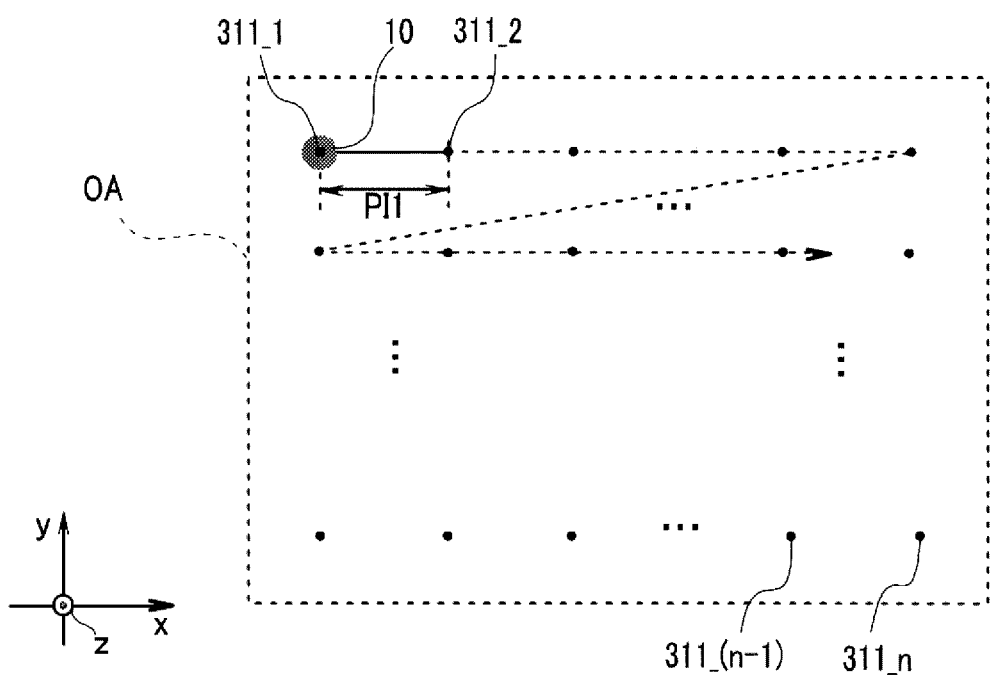
FIG. 9B is a view showing an example of disposition of radiation points in an observation area in the embodiment.

The procedure shown in FIG. 9A shows the specific procedure of S1 in FIG. 3. Further, FIG. 9B is a view showing an example of disposition of radiation points in the observation area in the embodiment.

First, the observation area OA is set on the surface of the sample 31, and the radiation point interval PI1 is set (S11). The observation area OA and the radiation point interval PI1 in S11 are set in the same manner as in S101 of FIG. 5. That is, as shown in FIG. 9B, the disposition of the radiation points 311_1, 311_2, . . . , 311_n of the electron beam 10 in the observation area OA is the same as the disposition in the comparative example (FIG. 6). That is, in S11, the radiation points 311_1, 311_2, . . . , 311_n are disposed discretely at regular intervals PI1 to reduce the number of radiation points 311 and shorten the processing time. Next, the incidence angle θ of the electron beam 10 is set to 0° (S12). That is, the scanning coil 13 is controlled so that the electron beam 10 is vertically incident on the surface of the sample 31.

Subsequently, the radiation position of the electron beam 10 is set to the first radiation point 311_1 in the observation area OA (S13). That is, the control unit 40 controls the scanning coil 13 so that the radiation position of the electron beam 10 (convergence point on the surface of the sample 31) coincides with the radiation point 311_1. Then, the surface of the sample 31 is irradiated with the electron beam 10, and the dark field intensity is detected by the dark field detector 21 (S14).

When the current radiation point 311_i set as the radiation position of the electron beam 10 is not the last radiation point 311_n, that is, when there is a radiation point 311 whose dark field intensity has not been detected in the observation area OA (S15, NO), the radiation position of the electron beam 10 is moved from the current radiation point 311_i to the next radiation point 311_(i+1) according to the radiation point interval PI1 set in S11 (S16). Then, S14 is executed for the set radiation point 311 (i+1) to acquire the dark field intensity.

On the other hand, when the current radiation point 311_i is the last radiation point 311_n, that is, when the detection of the dark field intensity is completed for all the radiation points 311 in the observation area OA (S15, YES), the dark field intensity acquired at each radiation point 311 is mapped to generate a dark field image (S17). As described above, by executing a series of procedures from S11 to S17, the acquisition (S1) of an image (electron diffraction image) in the observation area OA is completed.

Figure 10A:
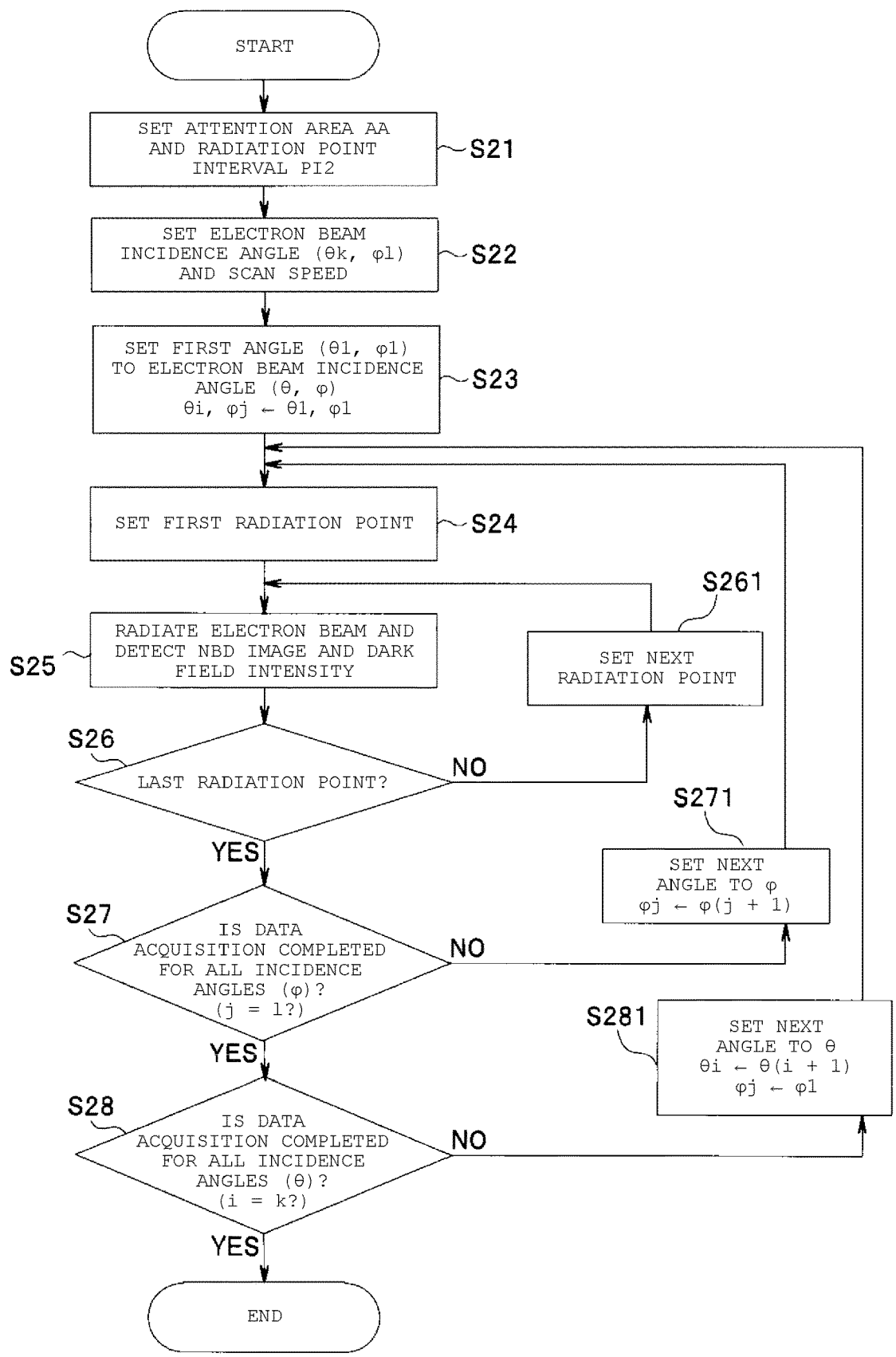
FIG. 10A is a flowchart showing an example of the analysis procedure in the embodiment.
Figure 10B:
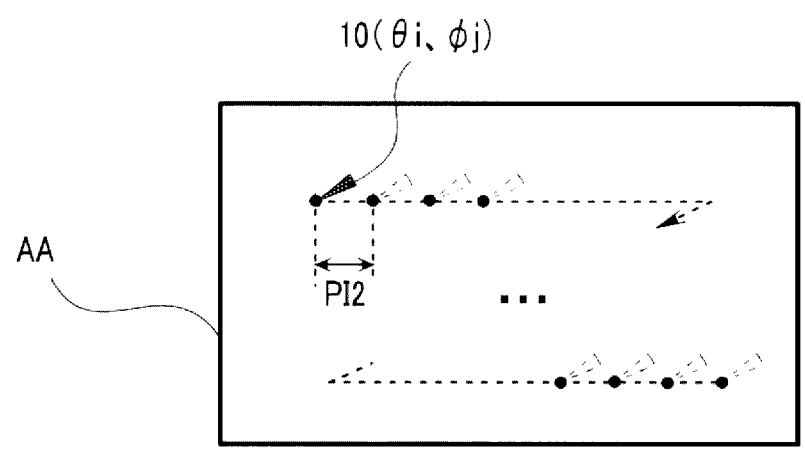
FIG. 10B is a view showing an example of disposition of radiation points in an attention area in the embodiment.

FIG. 10A is a flowchart showing an example of the analysis procedure in the embodiment. The procedure shown in FIG. 10A shows a specific procedure in S2 of FIG. 3. Further, FIG. 10B is a view showing an example of disposition of radiation points in the attention area in the embodiment. First, the attention area AA is set in the observation area OA. Further, the radiation point interval PI2 is set (S21). The attention area AA is an area to be analyzed for specifying the crystal orientation. The attention area AA is extracted from the dark field image generated in S1. As shown in FIG. 10B, the radiation point interval PI2 is set in the same manner as in the comparative example described with reference to FIG. 8.

Next, an incidence angle (θk, φl) of the electron beam 10 and a scan speed are set (S22). In the embodiment, the electron beam 10 is incident on one radiation point 311_j a plurality of times with the angles θ and φ changed. Specifically, in S22, k incidence angles are set in the θ direction and l incidence angles are set in the φ direction. That is, the electron beam 10 is radiated to one radiation point 311_j at an incidence angle of k×l=M, which is a combination of k incidence angles θk and l incidence angles φ.

The angle θ is set according to the diffraction pattern to be analyzed and the order of the diffraction lines to be acquired. Further, the angle φ is set according to the symmetry of the diffraction pattern and the measurement time. Further, the angle φ is preferably set so as to have symmetry with respect to the scanning direction. For example, when the angle φ=5° is set in a first round of radiation, the angle φ=−5° is set in any of a second and subsequent rounds of radiation. The incidence angles θ and p do not need to be set according to a predetermined rule as described above, and may be set irregularly. The scan speed defines the radiation time of the electron beam 10 with respect to one radiation point 311_j in one round of radiation. The exposure time at the radiation point 311 is calculated by multiplying the radiation time of the electron beam 10 in one round of radiation and the number of rounds of radiation. That is, the slower the scan speed and the larger the number of rounds of radiation, the longer the exposure time, and the clearer the electron diffraction image.

Next, an incidence angle (θ, φ) of the electron beam 10 is set in S22, and is set to an incidence angle (θ1, φ1) in the first round of radiation (S23). Further, the radiation position of the electron beam 10 is set to the first radiation point 311_1 in the attention area AA (S24). That is, the control unit 40 controls the scanning coil 13 so that the radiation position of the electron beam 10 (convergence point on the surface of the sample 31) coincides with the radiation point 311_1 and the incidence angle of the electron beam 10 is an angle θ1 and an angle φ1. Subsequently, the surface of the sample 31 is irradiated with the electron beam 10 at the set incidence angles (θ1, φ1), and an NBD image and a dark field intensity are acquired (S25).

When a current radiation point 311_o set as the radiation position of the electron beam 10 is not the last radiation point 311_m, that is, when there is a radiation point 311 whose NBD image and dark field intensity have not been acquired in the attention area AA (S26, NO), the radiation position of the electron beam 10 is moved from the current radiation point 311_o to the next radiation point 311_(o+1) according to the radiation point interval PI2 set in S21 (S261). Then, S25 is executed for the set radiation point 311_(o+1) to acquire the NBD image and the dark field intensity.

On the other hand, when the current radiation point 311_o is the last radiation point 311_m, that is, when the acquisition of the NBD image and the dark field intensity is completed for all the radiation points 311 in the attention area AA (S26, YES), with respect to the incidence angle φ, it is determined whether the scanning of the attention area AA has been performed for all the incidence angles set in S22 (S27).

With respect to the incidence angle φ, when there is an angle at which scanning is not performed (S27, NO), the incidence angle φ of the electron beam 10 is changed from the currently set incidence angle φj to the next incidence angle φ(j+1) (S271). Then, a series of procedures from S24 to S27 are executed and the set incidence angle (θi, φ(j+1)) is used to acquire the NBD image and the dark field intensity for all the radiation points 311_1 to 311_m in the attention area AA.

On the other hand, when scanning is performed for all incidence angles set in S22 with respect to the incidence angle φ (S27, YES), with respect to the incidence angle θ, it is determined whether the scanning of the attention area AA has been performed for all the incidence angles set in S22 (S28). With respect to the incidence angle θ, when there is an angle at which scanning is not performed (S28, NO), the incidence angle θ of the electron beam 10 is changed from the currently set incidence angle Gi to the next incidence angle θ(i+1). Further, the incidence angle φ of the electron beam 10 is changed from the currently set incidence angle φl to the first incidence angle φ1 (S281). Then, a series of procedures from S24 to S27 are executed and the set incidence angle (θ(i+1), φ1) is used to acquire the NBD image and the dark field intensity for all the radiation points 311_1 to 311_m in the attention area AA.

On the other hand, with respect to the incidence angle θ, when scanning is performed for all the incidence angles set in S22 (S28, YES), it is determined that the acquisition of the NBD image and the dark field intensity is completed for the set k×l=M incidence angles, and the acquisition (S2) of the image (electron diffraction image) in the attention area AA is completed.

Figure 12:
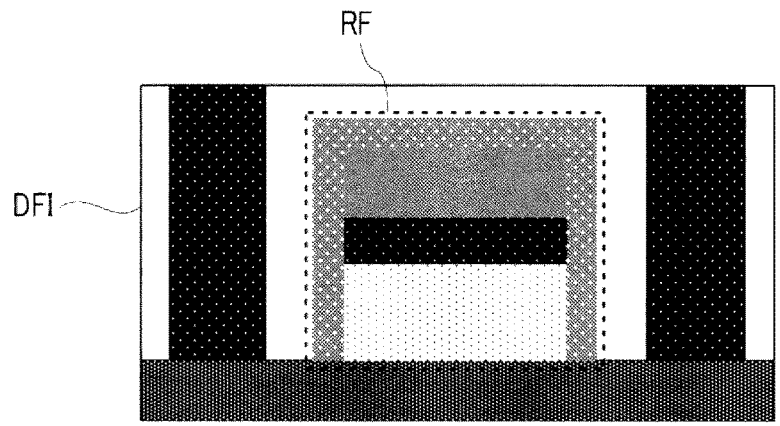
FIG. 12 is an image view showing an example of a dark field image in the attention area.

FIG. 11 is a flowchart showing an example of the analysis procedure in the embodiment. The procedure shown in FIG. 11 shows a specific procedure in S3 of FIG. 3. First, the dark field intensity acquired at each radiation point 311_1 to 311_m is mapped for each incidence angle (θk, φl) to generate a dark field image (S31). FIG. 12 is an image view showing an example of a dark field image in the attention area. By executing S31, M dark field images DFI as shown in FIG. 12 are generated.

Next, the position is corrected based on the M dark field images DFI generated in S31 (drift correction, S32). In the process of acquiring an NBD image while scanning the inside of the attention area AA in S2, there is a possibility that the incident position of the electron beam 10 may be displaced during the M round of scan. Therefore, the positions are corrected so that the reference patterns of M dark field images DFI_1 to DFI_M match.

Drift correction is performed, for example, as follows. First, the dark field image DFI_1 acquired on a first image is used as a reference image, and a reference pattern RF for position shift correction is set. For example, a portion such as a quadrangle surrounded by a dotted line in FIG. 12 in which a change in brightness clearly appears and a shape is easy to identify may be set as the reference pattern RF, or a marker that serves as a reference pattern may be formed in advance in the attention area AA. Next, the reference pattern RF is detected in each of the second to M dark field images DFI 2 to DFI_M (reference image). Then, the difference between the position of the reference pattern RF in the reference image and the position of the reference pattern in each reference image is detected. Finally, the coordinates of the radiation points 311_1 to 311_m in each reference image are corrected according to the difference.

Figure 13:
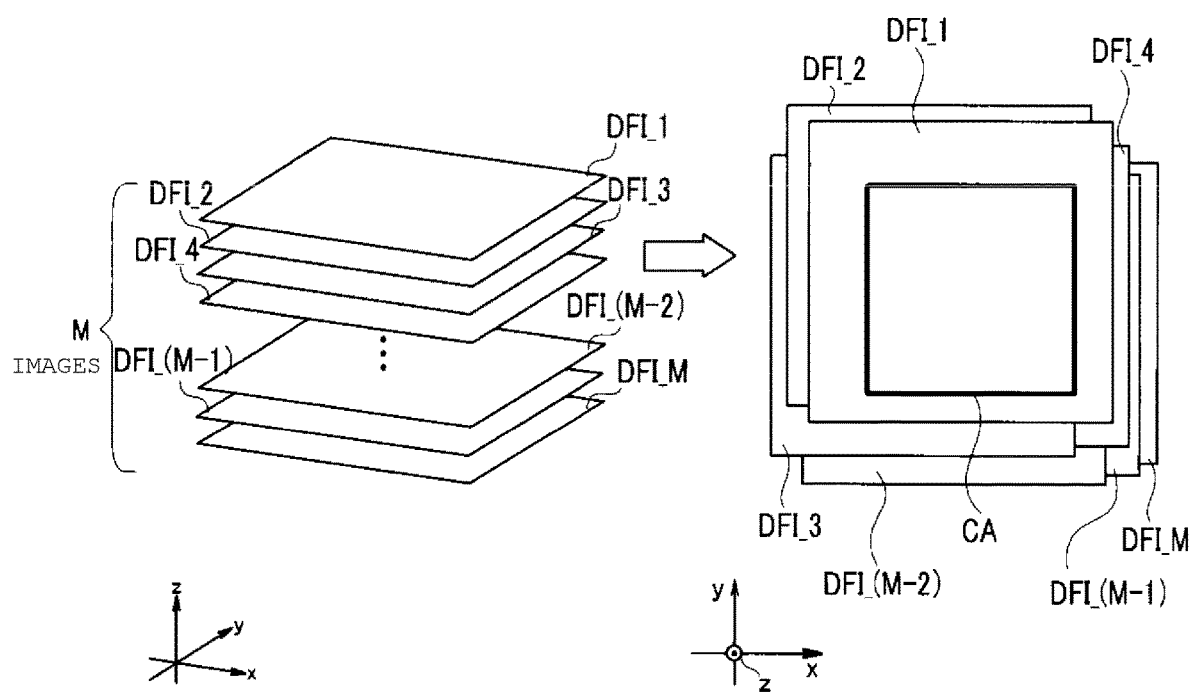
FIG. 13 is a view showing drift correction using the dark field image.

FIG. 13 is a view showing drift correction using a dark field image. As shown on the left side of FIG. 13, by using M dark field images DFI_1 to DFI_M and performing drift correction using the reference pattern RF or the like, as shown on the right side of FIG. 13, the position of each dark field image DFI is corrected. In the M dark field images DFI_1 to DFI_M after drift correction shown on the right side of FIG. 13, the area where all the images overlap is shown as a correction area CA.

Figure 14:
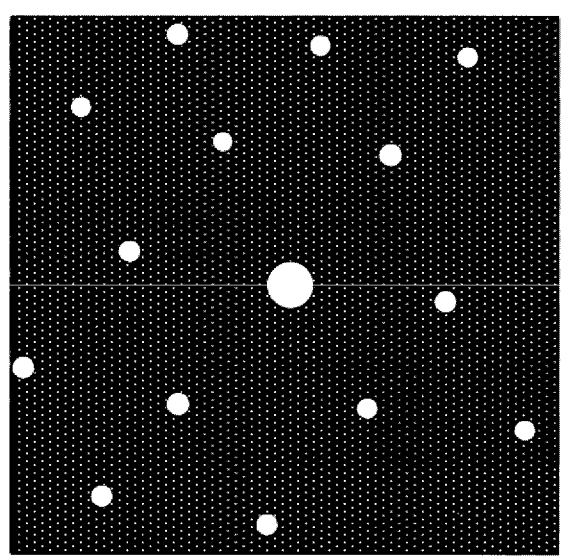
FIG. 14 is an image view showing an example of an integrated NBD image.

Next, using the correction coordinates after the drift correction, an NBD image having the same coordinates (correction coordinates) of the radiation point 311 is extracted from the NBD images acquired for each incidence angle (θk, φl) (S33). In S33, the NBD image of the selected radiation point 311 is extracted from the plurality of radiation points whose correction coordinates exist in the correction area CA. Subsequently, the extracted M NBD images are integrated to generate an integrated NBD image (S34). Specifically, the electron detection intensities at the same coordinates (same coordinates in the reciprocal space) are integrated for the M NBD images extracted in S33. FIG. 14 is an image view showing an example of the integrated NBD image. By acquiring and integrating the plurality of NBD images at different incidence angles, the electron detection intensity can be increased, thereby improving the detection accuracy.

Finally, the integrated NBD image is used to analyze the crystal orientation of the radiation point 311 selected in S33 (S35). Specifically, the integrated NBD image generated in S34 is compared with the plurality of NBD images (templates) calculated in advance for various crystal orientations and stored in the database. The crystal orientation of the template with the highest degree of matching is identified as the crystal orientation at the selected radiation point.

Similar to the comparative example, the crystal orientation mapping of the correction area CA can be generated for a plurality of radiation points having correction coordinates in the correction area CA, by analyzing the crystal orientation with the integrated NBD and assigning the same mark to the radiation points having the same crystal orientation, or by connecting the radiation points having the same crystal orientation with a line.

As described above, according to the analysis method of the embodiment, each of the plurality of radiation points 311 set in the attention area AA is scanned a plurality of times while changing the incidence angle of the electron beam 10. Specifically, the attention area AA is scanned at a certain incidence angle, NBD images of all the radiation points 311 in the attention area AA are acquired, and then the attention area AA is scanned at the next incidence angle to acquire NBD images of all radiation points 311 within the attention area AA. On the other hand, in the comparative example, an NBD image (precession NBD image) is acquired while making the electron beam 10 precede with respect to one radiation point 311. That is, the integrated NBD image generated by superimposing the plurality of NBD images acquired in time division in the embodiment corresponds to the precession NBD image of the comparative example.

In the analysis method of the embodiment, the time during which the electron beam 10 is radiated to one radiation point 311 in one scan is, for example, about several μs, whereas in the comparative example, the time for irradiating one radiation point 311 with the electron beam 10 in order to make the electron beam 10 precede is, for example, about several tens of μs to several ms. Therefore, since the time during which the electron beam 10 is continuously radiated to one radiation point 311 (electron beam residence time) can be shortened as compared with the comparative example, damage to the sample 31 due to the electron beam 10 can be reduced.

Further, according to the analysis method of the embodiment, the dark field intensity is acquired at the same time as the NDB image. By comparing the dark field images generated for each incidence angle, which are generated based on the dark field intensity, the shift of the radiation position of the electron beam 10 can be detected. Further, the position of the radiation point 311 from which each NBD image is acquired can be corrected by using the detected shift. In the comparative example, the radiation position of the electron beam 10 may shift during the precession movement, but the diffracted electrons are integrated and continuously detected during the precession, and therefore the precession NBD image may become an image with the shift of the radiation position, and the detection accuracy may decrease. On the other hand, according to the analysis method of the embodiment, since the integrated NBD image is generated by using the NBD image in which the positions of the radiation points after correction are the same, the detection accuracy can be improved.

As described above, according to the analysis method of the embodiment, it is possible to acquire an electron diffraction image with high accuracy while reducing damage to the sample due to electron beam radiation.

According to the analysis method of the embodiment, since the incidence angle (θ, φ) of the electron beam 10 may be set freely, in addition to the NBD image used to generate the crystal orientation mapping by template matching described above, it is possible to acquire an NBD image to be used for various methods. For example, an NBD image used for crystal structure analysis by the rotation electron diffraction (RED) method can be acquired. Specifically, a plurality of NBD images are acquired while tilting the sample in one direction and tilting the electron beam 10 with respect to a specific radiation point of the sample (a plurality of NBD images are acquired while changing the angle). By three-dimensionally reconstructing these plurality of NBD images, the crystal structure of the sample can be analyzed.

Further, in the above description, the method of extracting the attention area AA using the dark field image has been described. It is noted that, as in the comparative example, the electron intensity of the area caused by the electrons transmitted through the sample 31 is detected by the electron beam detector 22 to generate a pseudo bright-field image, and the attention area AA may be extracted by using the pseudo bright-field image.

Further, in the above description, after extracting the NBD image having the same coordinates (correction coordinates) of the radiation point 311 from the NBD image acquired for each incidence angle (θk, φl), the integrated NBD image (planar image in reciprocal space) is generated by integrating the electron beam intensities. Alternatively, the extracted NBD image may be three-dimensionally reconstructed to generate a three-dimensional NBD image (three-dimensional image in reciprocal space). For example, based on the NBD image with an incidence angle θ=0°, by converting the two-dimensional coordinates (kx, ky) of other NBD images into three-dimensional coordinates (kx', ky', kz') based on the incidence angle θk, three-dimensional reconstruction can be realized.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An analysis method using a scanning transmission electron microscope including: (a) an annular first detector that detects dark field images in a sample by accelerating electron beams emitted from a beam radiator, irradiating the sample so that focal points of the electron beams are located on the sample, and detecting electron beams transmitted through the sample or scattered from the sample; and (b) a second detector that detects electron diffraction images of the sample at radiation positions of the electron beams by detecting electron beams transmitted through a hollow portion of the first detector among the electron beams transmitted through the sample or scattered from the sample, the method comprising:
scanning a plurality of radiation points in an analysis area on a surface of the sample by sequentially radiating the electron beams at preset incidence angles; and
detecting the dark field images of the analysis area and detecting the electron diffraction image at each of the plurality of radiation points at the same time.

2. The analysis method according to claim 1, further comprising:
determining a plurality of the incidence angles;
detecting the dark field image and the electron diffraction image for each of the plurality of radiation points at each of the incidence angles;
detecting a relative shift amount of a plurality of the detected dark field images;
correcting a position of the radiation point based on the shift amount; and
generating an integrated electron diffraction image by integrating a plurality of the electron diffraction images acquired from radiation points having the same corrected position.

3. The analysis method according to claim 2, wherein the electron beam is converged and radiated to the sample as a micro electron beam.

4. The analysis method according to claim 2, wherein the incidence angle is determined based on a combination of a first angle formed by a direction perpendicular to the surface of the sample and a direction of an incidence center axis of the electron beam and a second angle formed by a direction of scanning the plurality of radiation points and the direction of the incidence center axis of the electron beam, the first angle and the second angle being independent from each other.

5. The analysis method according to claim 4, wherein the step of scanning the plurality of radiation points includes a first scanning operation and a second scanning operation,
in the first scanning operation, each of the plurality of radiation points is irradiated with a first set of the first angle and the second angle, and
in the second scanning operation, each of the plurality of radiation points is irradiated with a second set of the first angle and the second angle.

6. The analysis method according to claim 5, wherein the step of detecting the dark field image and the electron diffraction image includes a first dark field image generation operation and a second dark field image generation operation,
in the first dark field image generation operation, a first dark field image is generated based on a result of the first scanning operation, and
in the second dark field image generation operation, a second dark field image is generated based on a result of the second scanning operation.

7. The analysis method according to claim 2, wherein each of a plurality of the electron diffraction images acquired from the radiation points having the same corrected position is converted into three-dimensional coordinates based on the first angle, and the electron diffraction images are integrated based on the converted coordinates to generate the integrated electron diffraction image.

* * * * *